United States Patent [19]

Kano et al.

[11] 3,757,176

[45] Sept. 4, 1973

[54] PRESSURE SENSITIVE TRANSISTOR HAVING A SCHOTTKY BARRIER JUNCTION FORMED IN THE EMITTER

[75] Inventors: Gota Kano, Otokuni-gun, Kyoto; Hideomi Kato, Takatsuki-shi, both of Japan

[73] Assignee: Matsushita Electronics Corporation, Osaka, Japan

[22] Filed: Sept. 29, 1971

[21] Appl. No.: 184,929

Related U.S. Application Data

[63] Continuation of Ser. No. 867,794, Oct. 20, 1969, abandoned.

[30] Foreign Application Priority Data

Oct. 28, 1968 Japan ............................ 43/80156
Oct. 28, 1968 Japan ............................ 43/80157

[52] U.S. Cl.. 317/235 R, 317/235 M, 317/235 UA, 317/234 R

[51] Int. Cl.......................... H01l 11/00, H01l 15/00

[58] Field of Search.................... 317/234, 235, 31, 317/5.4, 26, 5.3

[56] References Cited

UNITED STATES PATENTS

| | | | |
|---|---|---|---|
| 2,634,322 | 4/1953 | Law | 317/235 U |
| 3,319,140 | 5/1967 | Toussaint et al. | 317/235 |
| 3,397,450 | 8/1968 | Bittmann et al. | 317/235 U |
| 3,443,041 | 5/1969 | Kahng et al. | 317/235 |
| 3,463,975 | 8/1969 | Biard | 317/235 U |
| 3,518,508 | 6/1970 | Yamashita et al. | 317/235 |
| 3,615,929 | 10/1971 | Portnoy et al. | 317/235 U |

*Primary Examiner*—John W. Huckert
*Assistant Examiner*—Andrew J. James
*Attorney*—Stevens, Davis, Miller & Mosher

[57] ABSTRACT

A pressure sensitive semiconductor device which has a schottky barrier junction at an electrode lead-out portion of one region of a p-n-p or n-p-n structure transistor and to which a pressure sensitive junction is formed by providing a pressure applying means to the schottky barrier junction which has a high sensitivity since it amplifies a pressure response signal by the amplifying action of the transistor.

1 Claim, 8 Drawing Figures

G. KANO AND H. KATO
INVENTORS

BY Stevens, Davis, Miller & Mosher
ATTORNEY

PRESSURE SENSITIVE TRANSISTOR HAVING A SCHOTTKY BARRIER JUNCTION FORMED IN THE EMITTER

This is a continuation, of application Ser. No. 867,794, filed Oct. 20, 1969 and now abandoned.

This invention relates to a pressure sensitive semiconductor device having a novel structure.

In the past, the so-called pressure sensitive transistor has been generally known as the pressure sensitive semiconductor device, in which a pressure is applied to the emitter junction of a p-n junction type transistor to control the emitter injection efficiency on base recombination current and the pressure sensitive output is taken from the collector.

The device of the present invention differs completely from these conventional pressure sensitive transistors in principle, in which the pressure sensitive Schottky barrier junction is provided at an electrode lead-out portion of at least one region of a p-n-p or n-p-n junction transistor structure. Where the pressure sensitive Schottky barrier junction is a Schottky barrier junction of which the backward characteristic is made to be controlled by the application of a pressure, the collector current (collector output) is thereby made to be controlled.

What differs mostly from conventional pressure sensitive transistor is the fact that the conventional transistor is comprised by two rectifying junctions, that is, the emitter junction and collector junction, while the device of the present invention is comprised by three rectifying junctions as described above.

Further, added to this fact, at the point of electrical characteristics this inventive device shows an increased collector current by an increasing pressure, while the conventional pressure sensitive transistor shows a decreased collector current by an increasing pressure.

Now, the present invention will be described with reference to the accompanying drawings of the preferred embodiments, in which.

Figure 1:
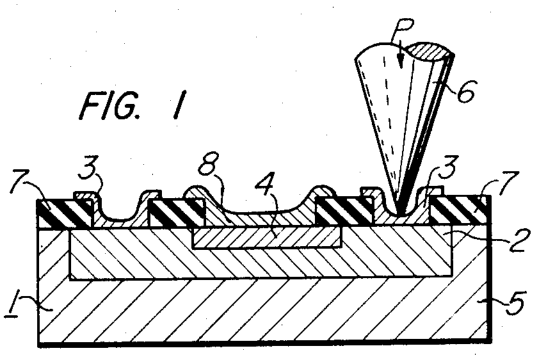
FIG. 1 is a side sectional view of an embodiment of a pressure sensitive semiconductor device according to the present invention.

Now, the first embodiment of the present invention wherein the Schottky junction formed by a metal-semiconductor junction is used as the base junction will be described with reference to the drawing. FIG. 1 is a rough sectional view illustrating the structure of a pressure sensitive semiconductor device according to an embodiment of the present invention.

In this embodiment, the surface impurity density of the base 2 of a planar type p-n-p transistor 1 is controlled to be $3 \times 10^{16}$ $cm^{-3}$ and the base Schottky junction is formed on it by depositing a molybdenum film 3 by means of the sputtering method, and other portions are manufactured by means of the standard manufacturing method of the planar p-n-p transistor.

In the pressure sensitive semiconductor device shown in FIG. 1 thus obtained, an ordinary bias voltage is applied to the emitter 4, base 3 and collector 5, and a pressure is applied to the base Schottky junction by a pressure needle 6. In FIG. 1, reference numeral 7 is a $SiO_2$ film and 8 is an ohmic metal electrode comprised of a film of A*l*.

Figure 2:
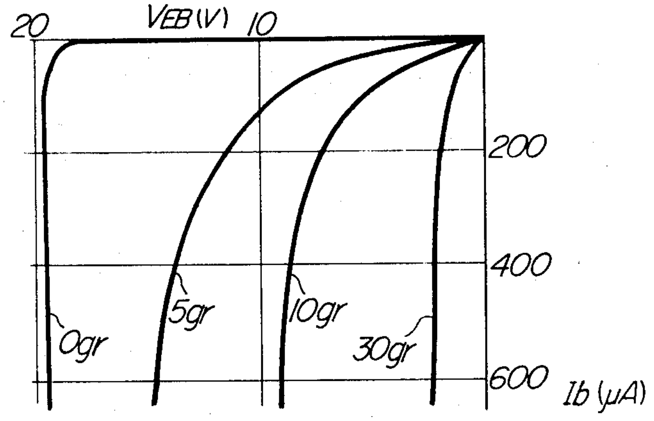
FIGS. 2 and 3 are graphs showing the characteristic curves of the device shown in FIG. 1.

In this device, the emitter junction is forward biased, then almost all of the voltage applied between the emitter and base is almost applied as the backward bias of the base Schottky junction the pressure sensing characteristic of the backward characteristic of the base Schottky junction is shown in FIG. 2. As can be seen from FIG. 2, the base current $I_b$ can be freely controlled by the applied pressure when the emitter-base voltage $V_{EB}$ is kept constant.

Figure 3:
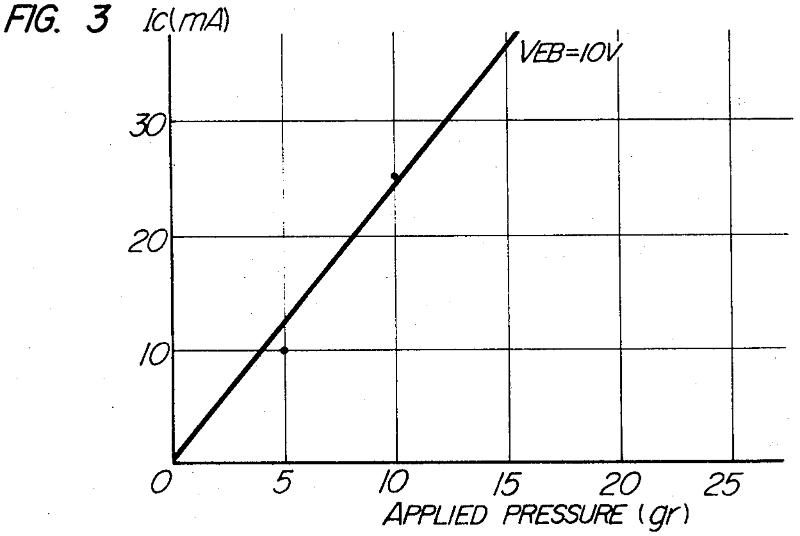

Therefore, a large controlled output current which resulted from the amplification of this variation is provided at the collector. A variation of the collector current $I_c$ to the applied pressure P of this embodiment is shown in FIG. 3. An example of the p-n-p transistor is taken in this embodiment, but of course this principle can be applied to the n-p-n transistor as well.

Figures 4, 5, 6:
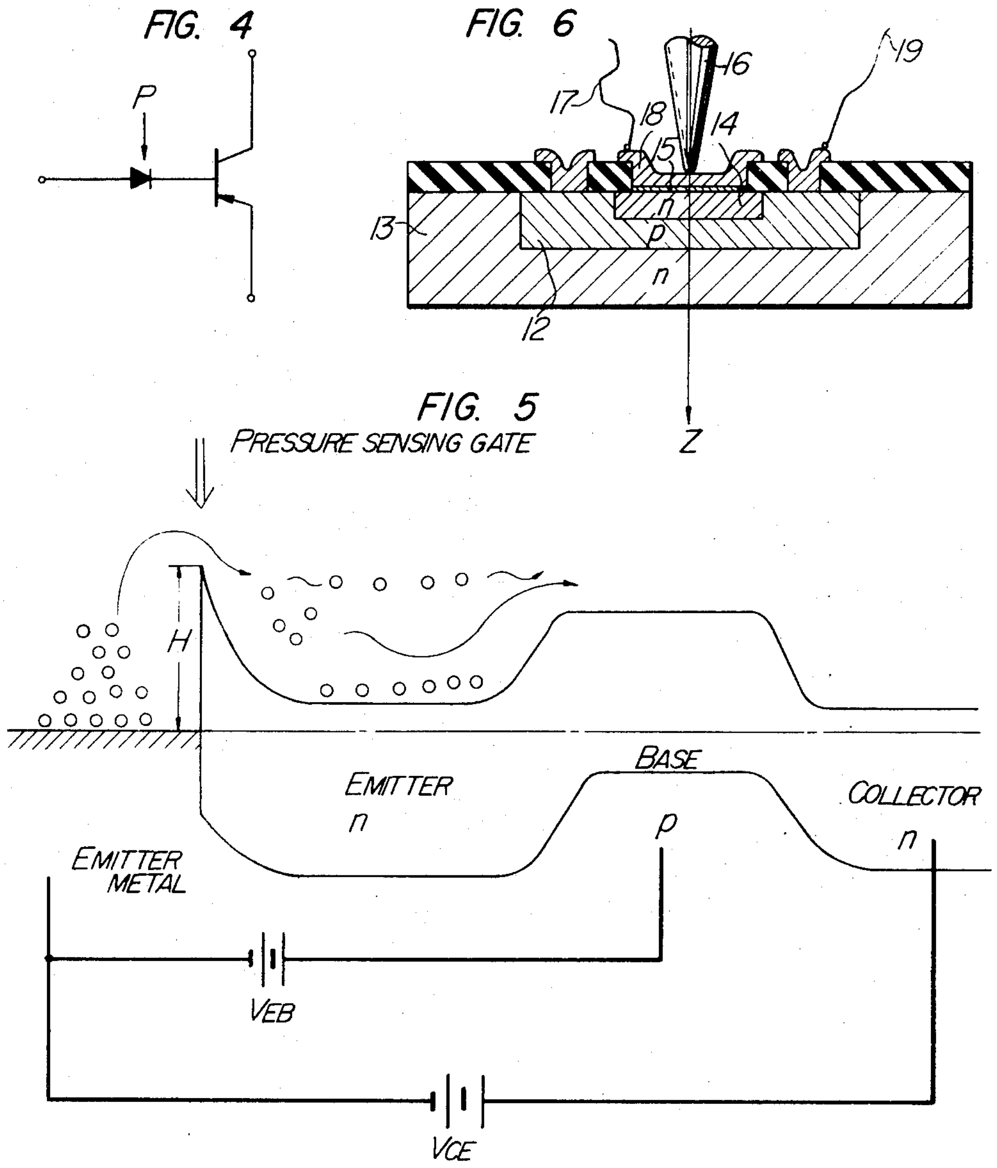
FIG. 4 is an equivalent circuit diagram illustrating the device of the first embodiment of the present invention.
FIG. 5 is a schematic band structure illustrating the operation of a pressure sensitive semiconductor device according to a second embodiment of the present invention.
FIG. 6 is a side sectional view of the pressure sensitive semiconductor device according to the second embodiment of the present invention.

FIG. 4 is an equivalent circuit diagram illustrating said embodiment device which has essentially such a structure that the pressure sensitive Schottky barrier junction is connected to the base electrode of a p-n-p or n-p-n junction transistor.

Now, a second embodiment of the present invention will be described below. In the second embodiment as is shown in FIG. 5 by a band structure illustrating the principles of operation and structure, a metal n-type semiconductor Schottky barrier is formed on the surface of the emitter region of a n-p-n junction transistor and a pressure sensing gate is provided by providing a pressure means to it, then the number of electrons injected into the emitter is controlled by applying a pressure to the pressure sensing gate, thus the collector current is controlled. In this embodiment, a voltage applied between the emitter (metal) and base is applied to the said Schottky barrier, referred to in the above as a pressure sensing gate. Therefore, injected electrons are injected into the n-type emitter overcoming the barrier (height H). In this case, if a pressure is applied to the pressure sensing gate, the height H of the barrier will change depending upon the pressure as will be described later. That is, the quantity of electrons to be injected changes depending upon the applied pressure. After the electrons are injected into the base, they are amplified according to the principle of the operation of a transistor and the collector current changes.

FIG. 6 is a sectional view illustrating the structure of the pressure sensitive transistor of the present invention. It should be obvious that when a concentrated stress is applied to a pressure needle 16, the portion of the semiconductor body where the stress is most strongly applied in the Z-axis direction is the surface of the emitter region 14.

In fact, according to detailed theoretical calculations, the change of the energy gap Eg of the semiconductor which constitutes the reason for producing the change in piezoelectricity becomes 50 percent and 15 percent of the change of $Eg$ at 2=0 at the place of 2=1$\mu$ and 2=2$\mu$, respectively, assuming that the force is applied uniformly over the whole contact area.

When such a difference in an energy gap becomes converted into a current change, it constitutes a difference of the order of one figure, and it is very advantageous that a pressure sensitive barrier exists at the surface ($Z$=0).

On the other hand, it was very difficult to form the emitter junction as near to the surface as possible in the conventional p-n junction type transistor and a place of $Z$=1.0$\mu$ was the limit.

Therefore, it can be seen that the pressure sensitive transistor according to the present invention has a widely different high sensitivity. Now, in FIG. 6, the reference numeral 14 is the emitter, 12 the base, 13 the collector, 15 the Schottky barrier portion, 18 a metal portion consisting of, for example, Mo which constitutes the Schottky barrier junction together with the emitter region 14, 17 a lead connected in ohmic contact to said metal, and 19 a base lead. a concrete construction of this second embodiment will be described below.

Boron is diffused into a n-type substrate having a resistivity of 2 – 4$\psi$-cm to make the base width 2$\mu$ and the base surface density $10^{16}$ cm$^{-3}$, then phosphorus is diffused into it to make the emitter depth 3$\mu$ and the emitter surface density $5 \times 10^{16}$ cm$^{-3}$, thus a usual n-p-n planar transistor is prepared. Then molybdenum is deposited only on the emitter surface to form the pressure sensitive Schottky barrier of the present invention.

Figure 7:
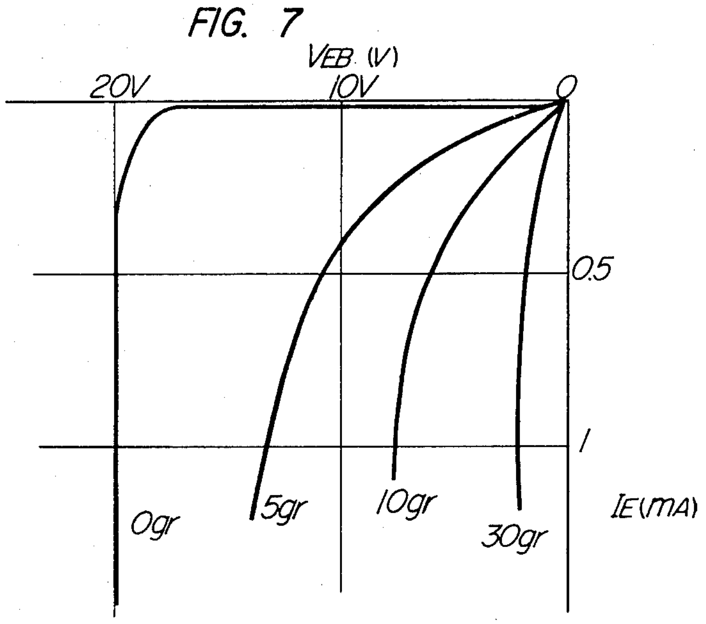
FIGS. 7 and 8 are graphs showing the characteristics of the device shown in FIG. 6.
Figure 8:
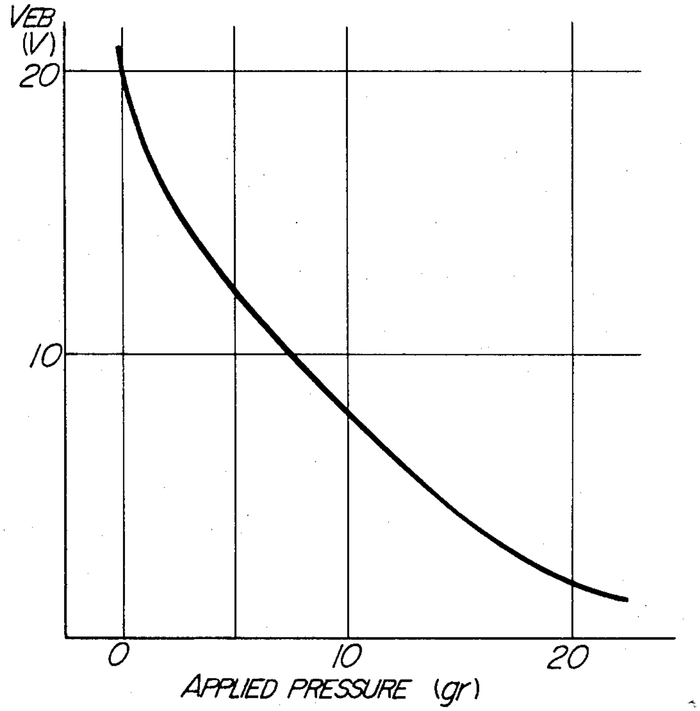

An example of the pressure sensing characteristics of the transistor thus obtained is shown in FIGS. 7 and 8. That is, FIG. 7 is a graph showing the pressure sensing characteristic of the emitter pressure sensitive gate making the applied pressure $p$ as a parameter where $V_{EB}$ indicates the voltage applied to the p-n junction between the emitter and base and $I_E$ is the emitter current. FIG. 8 is a graph showing the pressure sensing characteristic of the emitter-base voltage $V_{EB}$ which is required to produce the collector current of 2mA when the base current is 10$\mu$A.

As has been described in detail in conjunction with some embodiments, the device of the present invention is provided by forming the Schottky barrier junction on the surface of at least one electrode lead-out portion of a semiconductor body having the transistor structure of a p-n-p or n-p-n junction and fixing a pressure means for applying a pressure to the Schottky barrier junction, thus a device with high sensitivity can be obtained since the control of the collector current corresponding to the applied pressure is possible. Moreover, the p-n-p junction which performs the transistor action and Schottky barrier junction are constructed by a single chip (one substrate), and its manufacture is easy.

What is claimed is:

1. A pressure sensitive semiconductor transistor, comprising a body of a semiconductor material of one conductivity type; first and second regions formed in said semiconductor body, said first region being of a conductivity type opposite to said one type while said second region being of a conductivity type similar to said one type, said first and second regions being disposed in said semiconductor body to comprise, respectively, base and emitter regions of said transistor, the remaining portion of said body comprising the collector region; at least one metal electrode disposed on said emitter region to form a Schottky barrier junction therebetween; and means for applying a pressure to said Schottky barrier junction.

* * * * *